(12) United States Patent
Iliasevitch et al.

(10) Patent No.: US 6,724,234 B1
(45) Date of Patent: Apr. 20, 2004

(54) SIGNAL-LEVEL COMPENSATION FOR COMMUNICATIONS CIRCUITS

(75) Inventors: Stepan Iliasevitch, Nepean (CA); Marinette Annie Besson, Ottawa (CA); Florin Pera, Kanata (CA)

(73) Assignee: Nortel Networks Limited, St. Laurent (CA)

(*) Notice: Subject to any disclaimer, the term of this patent is extended or adjusted under 35 U.S.C. 154(b) by 379 days.

(21) Appl. No.: 09/661,082

(22) Filed: Sep. 13, 2000

(30) Foreign Application Priority Data

Sep. 17, 1999 (CA) .............................................. 2282862

(51) Int. Cl.⁷ .............................................. G05F 1/10
(52) U.S. Cl. ........................................ 327/378; 327/513
(58) Field of Search ................................ 327/513, 378, 327/362, 437

(56) References Cited

U.S. PATENT DOCUMENTS 6,104,232 A * 8/2000 Filip .......................... 327/513

FOREIGN PATENT DOCUMENTS

JP         06343044    *  6/1993

* cited by examiner

Primary Examiner—Dinh T. Le

(57) ABSTRACT

A signal-level compensating system consists of a voltage-follower stage, a sensor and a output signal compensator. The voltage-follower stage includes a signal input for receiving an input signal, a signal output, and at least one transistor coupled between the signal input and the signal output for providing an output signal responsive to the input signal. The sensor provides a control signal indicative of variations in at least one of the power supply voltage and transistor characteristics of the transistor. The output signal compensator is coupled to the signal output and provides a compensator output signal responsive to the control signal for reducing the impact of the variations on the voltage-follower output signal.

22 Claims, 7 Drawing Sheets

FIG. 2i  FIG. 2j

SIGNAL-LEVEL COMPENSATION FOR COMMUNICATIONS CIRCUITS

FIELD OF THE INVENTION

The present invention relates to a circuit for communicating electronic signals. In particular, the present invention relates to a system for compensating for signal level variations in communications circuits.

BACKGROUND OF THE INVENTION

It is often desirable in communications circuits to compensate for variations in power supply voltages. It is also desirable to compensate for variations in transistor characteristics arising from changes in operating conditions, such as temperature. These features are particularly advantageous for low voltage applications, where a variation in power supply voltage and/or base-emitter voltage can cause output signal voltages to vary sufficiently so as to no longer comply with the appropriate signal specification.

Attempts have been made at compensating for power supply voltage variations in communications circuits where the input signals to the communications circuits are referenced to the power supply voltage. For instance, in one implementation, a control circuit monitors the power supply voltage and injects compensating currents into the communication circuit input stage to counter the effect of power supply variations on the current levels in the input stage. However, such implementations are unsuitable for high frequency applications using low power supply voltages, since the injected current can cause the voltage drop across the current sink transistors coupled to the input stage to become undesirably low. Further, such implementations are ill-suited for applications where the power supply voltage is low or is susceptible to large variations, since the current sink transistors driving the input stage may become saturated. Also, voltage compensation at the input stage may leave insufficient head room for output signal swing.

Accordingly, there remains in need for a system for compensating for signal level variations in communications circuits arising from variations in supply voltage and/or transistor characteristics.

SUMMARY OF THE INVENTION

According to the present invention, there is provided a signal level compensating system for communications circuits which addresses the deficiencies of the prior art. The term "communications circuit" is used herein in its generic sense as any circuit which is capable of conveying an electronic signal between an input and an output.

According to an aspect of the present invention, the signal level compensator comprises a voltage-follower stage, a sensor and an output signal compensator. The voltage-follower stage includes a signal input for receiving an input signal, a signal output, and at least one transistor coupled between the signal input and the signal output for providing an output signal responsive to the input signal. The sensor senses variations in at least one of the power supply voltage and transistor characteristics of the transistor and provides a control signal indicative of the variation. The output signal compensator is coupled to the signal output and provides a compensator output signal responsive to the control signal for reducing the impact of the variations on the output signal.

According to a further aspect of the present invention, there is provided a signal-level shifter including: a voltage-follower stage including a voltage-follower input for receiving an input signal, a voltage-follower output, and a voltage-follower stage transistor coupled between the voltage-follower input and the voltage-follower output for providing an output signal at the voltage-follower output responsive to the input signal; an output stage coupled to the voltage-follower stage and including an output stage transistor for shifting a signal level of the output signal a sensor for sensing variation in at least one of characteristic of the transistors and voltage of a power supply powering the signal-level shifter and providing a control signal indicative of the variations; and an output signal compensator control signal for reducing the impact of the variations an the output signal.

According to a further aspect of the present invention, there is provided a method of compensating for signal-level variations in communications circuits. The method includes the steps of: providing a voltage-follower including a signal input for receiving an input signal, a signal output, and at least one transistor coupled between the signal input and the signal output for providing an output signal at the signal output responsive to the input signal; sensing variations in at least one of characteristics of the transistor and a voltage of a power supply powering the voltage-follower and providing a control signal indicative of the variations; and adding a compensating signal to the output signal, the compensating signal being responsive to the control signal and having a phase opposite to the variations.

In one aspect of the invention, the voltage-follower stage comprises a pair of transistors configured to receive differential input signals, and a resistive load stage coupled to the outputs of the voltage-follower transistors. The sensor comprises a transistor matched to the voltage-follower transistors and a resistor matched to the resistors of the resistive load stage, and provides control signals to the output signal compensator representative of variations in power supply voltage and voltage drop (eg. base-emitter, gate-source) of the voltage-follower transistors. The output signal compensator is coupled to the sensor, and comprises transistors configured as a current mirror coupled to the resistive load stage.

The output current level provided by the output signal compensator is responsive to the control signal from the current sensor, and cancels variations in output signal at the resistive load stage due to variations in power supply voltage and voltage drop at the voltage-follower stage.

In another aspect of the invention, the output of the voltage-follower stage is coupled to a pair of series-coupled differential voltage-followers for outputting the input signals in accordance with a desired signal specification. The sensor comprises transistors matched to the transistors of the voltage-follower stage and the series-coupled voltage-followers, and provides control signals to the output signal compensator representative of variations in power supply voltage and voltage drop (eg. base-emitter, gate-source) of the transistors of the voltage-follower stage and the series-coupled voltage-followers. The output signal compensator is coupled to the sensor and provides an output current responsive to the control signal from the current sensor, which cancels variations in output signal voltage at the output of the last of the series-coupled differential voltage-followers due to variations in power supply voltage and voltage drop of the transistors of the voltage-follower stage and the series-coupled voltage-followers.

In a preferred embodiment of the invention, the signal level compensating system is implemented as an integrated circuit on a single substrate, is powered by 3 volt power source, and receives CML input signals from an emitter-follower output stage external to the integrated circuit. The voltage-follower stage comprises a pair of NPN transistors, and the current mirror comprises insulated nMOS transistors for allowing the current mirror to operate below substrate voltage. The output of the voltage-follower stage is coupled to a pair of series-coupled emitter-followers for outputting the input signals as ECL output signals. The voltage-follower stage is coupled at its input to a signal-conditioner input stage which comprises a first differential buffer, a differential voltage-follower coupled to the output of the differential buffer, and a second differential buffer coupled to the output of the differential-emitter follower of the signal-conditioner input stage. The signal-conditioner input stage boosts the signal level of the input signals to the voltage-follower stage to provide sufficient headroom for compensating the power supply and base-emitter voltage variations.

BRIEF DESCRIPTION OF THE DRAWINGS

The preferred embodiments of the invention will now be described, by way of example only, with reference to the drawings, in which:

FIGS. 2a–2j are schematic diagrams of various implementations of the sensors shown in FIG. 1;

DETAILED DESCRIPTION OF THE PREFERRED EMBODIMENTS

Figure 1:
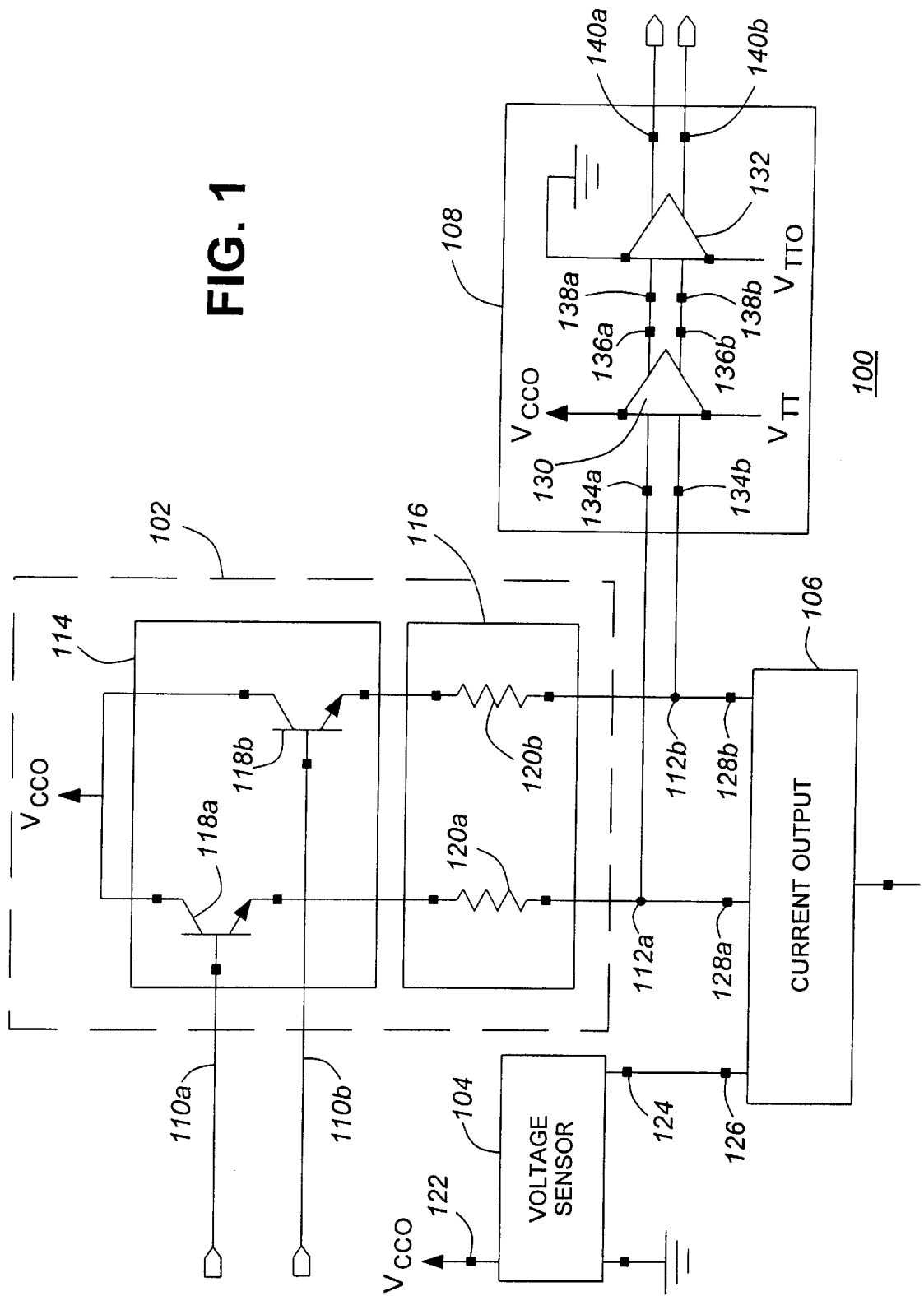
FIG. 1 is a schematic/block diagram of the signal-level compensating system according to the present invention for receiving differential input signals referenced to a power supply voltage and for providing differential output signals, and depicting the voltage-follower stage, the sensor, and the output signal compensator.

Turning to FIG. 1, a signal-level compensating communication system, denoted generally as 100, is shown comprising a voltage-follower stage 102, a sensor 104, an output signal compensator 106 and an output stage 108 all fabricated upon a common integrated circuit substrate. The signal-level compensating system 100 is shown being powered by a positive voltage source $V_{CCO}$=3 v, and a negative voltage source $V_{TT}$=$V_{TTO}$=−2 v, although other voltage references may be used. Further, the invention is not limited to an integrated circuit implementation but may also be implemented with discrete components.

The voltage-follower stage 102 includes differential signal inputs 110a, 110b for receiving differential input signals referenced to a positive power supply voltage, and differential signal outputs 112a, 112b for providing differential output signals responsive to the input signals. However, it should be understood at the outset that the invention is not limited to differential signal applications, but could be applied to single-ended applications, if desired, although differential signals are preferred due to their reduced susceptibility to noise and parasitic effects.

The voltage-follower stage 102 comprises a differential emitter-follower 114 and a resistive-load stage 116 coupled to the differential outputs of the differential emitter follower 114. The differential emitter-follower 114 comprises a pair of identical NPN transistors 118a, 118b, and the resistive-load stage 116 comprises a pair of identical resistors 120a, 120b. Alternately, the voltage-follower stage 102 may be implemented as with PNP transistors, or as a differential source-follower with FET transistors, or with any other transistor suitable for the intended application. Further, the resistive-load stage 116 may comprise transistors configured to provide an impedance between the differential outputs of the differential emitter-follower 114 and the differential signal outputs 112a, 112b.

The sensor 104 includes a sensor input 122 for sensing variations in the positive power supply voltage and base-emitter voltage of the transistors employed in the signal-level compensating system 100, and a control output 124 for providing a control signal including information representing variations in the positive power supply voltage and the base-emitter voltages. However, it should be understood that the sensor 104 need not sense both the positive power supply and base-emitter voltage variations in all applications, but might be used to sense only one of the positive power supply and base-emitter voltage variations where the output signal specification to be met is sufficiently forgiving.

Preferably, the sensor 104 also includes NPN transistors (not shown) which are matched to the transistors 118 of the voltage-follower stage 102 and the transistors of the output stage 108 (discussed below), and resistors (not shown) which are matched to the resistors 120a, 120b of the voltage-follower stage 102 and the resistors of the output stage 108. Therefore, the control signal output by the sensor 104 includes information representing variations in the positive power supply voltage, and variations in the base-emitter voltages of the transistors of the voltage-follower stage 102 and the output stage 108 arising from changes in operating conditions. The sensor 104 will be described in greater detail below with reference to FIG. 2.

The output signal compensator 106 includes control input 126 for receiving the control signal output by the sensor 104, and a pair of signal outputs 128a, 128b, each coupled to a respective differential signal output 112a, 112b of the voltage-follower stage 102. The signal outputs 128a, 128b provide output signals which are responsive to the control signal output by the sensor 104, and are scaled to cancel or at least substantially reduce variations in output voltage of the output stage 108 resulting from variations In the positive power supply voltage and variations in the base-emitter voltages of the transistors 118a, 118b of the voltage-follower stage 102 and transistors of the output stage 108. The output signal compensator 106 will be described in greater detail below with reference to FIG. 3.

The output stage 108 comprises a first differential voltage-follower 130, and a second differential voltage-follower 132 which together provide differential output signals representative of the differential input signals input to the voltage-follower stage 102 but shifted to desired output signal levels. However, it should be understood that the output stage 108 is not an essential feature of the invention and may be eliminated if the output signals of the differential signal outputs 112a, 112b of the voltage-follower stage 102 meet the desired output signal specification. In such a case, therefore, the control signal output by the sensor 104 will not include information representing variations in the base-emitter voltages of the transistors of the output stage 108, and the outputs 128*a*, 128*b* of the output signal compensator 106 will provide output currents which are only scaled to cancel or at least substantially reduce variations in output voltage due to variations in positive power supply voltage and variations in the base-emitter voltages of the transistors 118*a*, 118*b* of the voltage-follower stage 102. Further, the output stage 108 may comprise a greater or smaller number of voltage-followers as the output signal specification required.

The first differential voltage-follower 130 of the output stage 108 includes a first pair of identical NPN transistors (not shown), a pair of differential inputs 134*a*, 134*b*, and a pair of differential outputs 136*a*, 136*b*. Similarity, the second differential voltage-follower 132 includes a second pair of identical NPN transistors (not shown), a pair of differential inputs 138*a*, 138*b*, and a pair of differential outputs 140*a*, 140*b*. The transistors of the first and second differential voltage-followers 130, 132 are matched as close as possible to the transistors of the sensor 104. The differential inputs 134 of the first differential voltage-follower 130 are each coupled to a respective differential signal output 112*a*, 112*b*, and the differential inputs 138 of the second differential voltage-follower 132 are each coupled to a respective differential output 136*a*, 136*b* of the first differential voltage-follower 130.

FIGS. 2*a*–2*j* depict various implementations of the sensor 104. However, it should be understood at the outset that the sensor 104 is not limited to the variations shown in FIG. 2, but includes any sensor capable of sensing changes in at least one of the power supply voltage, and transistor characteristics of the transistors of the voltage-follower stage 102 and the first and second voltage-followers 130, 132.

Figure 2A:
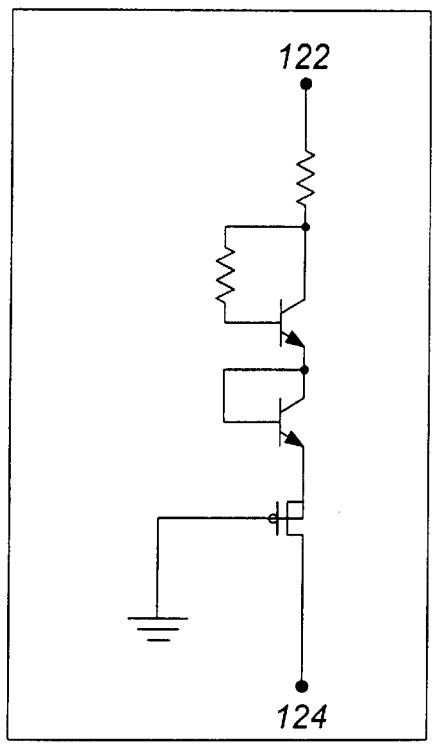
Figure 2B:
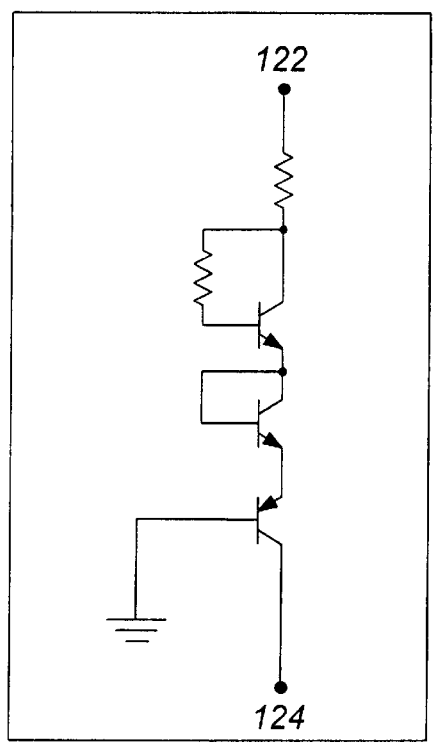
Figure 2C:
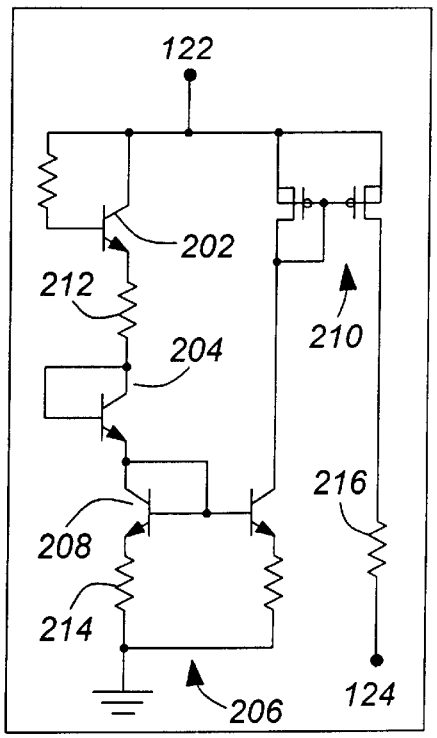

Turning to FIG. 2*c*, a preferred implementation of the sensor 104 is shown comprising a first diode-connected NPN transistor 202, a second diode-connected NPN transistor 204 series-coupled to the first diode-connected NPN transistor 202, a first NPN transistor-based current mirror 206 including a third diode-connected NPN transistor 208 series-coupled to the second diode-connected NPN transistor 204, and a second nMOS transistor-based current mirror 210 series-coupled to the current output of the first current mirror 206. The sensor 104 shown in FIG. 2*c* also includes a first resistor 212 in series with the first and second diode-connected transistors 202, 204 a second resistor 214 connected between the ground and the emitter of the third diode-connected transistor 208, and a third resistor 216 in series with the current output of the second current mirror 210.

From the following discussion, it will become apparent that the sensor 104 only includes three diode-connected transistors to sense changes in base-emitter voltage drops of the transistors 118*a*, 118*b*, the transistors of the first differential voltage-follower 130, and the transistors of the second differential voltage-follower 132. Therefore, it should be understood that the sensor 104 need not use three series-connected diode-connected transistors in all applications, but would preferably use the same number of diode-connected transistors as there are base-emitter voltage drops to be compensated. Further, the sensor 104 may comprise a mixture of transistor types (eg. PNP, NPN, FET) corresponding to the transistors used in the voltage-follower 102, and the output stage 108. Also, in applications where complete freedom from power supply and base-emitter (or gate-source) voltage variations is not required, the sensor 104 may use fewer or more diode-connected transistors than there are base-emitter voltage drops to be compensated.

With the implementation shown in FIG. 1, the change in control signal output current produced by the sensor 104 will be:

$$\Delta i_{ref} = \frac{\Delta V_{cco} - \Delta V_{be1} - \Delta V_{be2} - \Delta V_{be3}}{R_{212} + R_{214}}$$

where:
$\Delta i_{ref}$=change in control output current
$\Delta V_{cco}$=change in positive power supply voltage
$\Delta V_{be1}$=change in base-emitter voltage of transister 202
$\Delta V_{be2}$=change in base-emitter voltage of transister 204
$\Delta V_{be3}$=change in base-emitter voltage of transister 208
$R_{212}$=resistance of resister 212
$R_{214}$=resistance of resister 214

Preferably, the change in current output from each output 128*a*, 128*b* of the output signal compensator 106 is twice the change in output current produced by the sensor 104. With this design choice, the change in voltage drop across each resistor 120*a*, 120*b* of the voltage follower stage 102 will be:

$$\Delta V_{120} = 2R_{120} \times \frac{\Delta V_{cco} - \Delta V_{be1} - \Delta V_{be2} - \Delta V_{be3}}{R_{212} + R_{214}}$$

By setting the resistance of each resistor 120*a*, 120*b* of the voltage-follower stage 102 as:

$$R_{120} = \frac{R_{212} + R_{214}}{2},$$

and by matching the resistors 212, 214 of the sensor 104 to the resistors 120*a*, 120*b* of the voltage-follower stage 102, the change in voltage drop across each resistor 120*a*, 120*b* of the voltage-follower stage 102 due to changes in output control current produced by the sensor 104 will be:

$$\Delta V_{120} = \Delta V_{cco} - \Delta V_{be1} - \Delta V_{be2} - \Delta V_{be3}$$

Preferably, the transistors 118*a*, 118*b* of the voltage-follower stage 102 and the transistors of the output stage 108 are each completely matched to a respective diode-connected transistor 202, 204, 208 of the sensor 104, and the resistors of the output stage 108 are matched to the resistors 212, 214 of the sensor 104. Alternately, the current density of the transistors 118*a*, 118*b* of the voltage-follower stage 102 and the transistors of the output stage 108 may be matched to a respective diode-connected transistor 202, 204, 208 of the sensor 104.

Therefor:
$\Delta V_{be1} = \Delta V_{be4}$;
$\Delta V_{be2} = \Delta V_{be5}$; and
$\Delta V_{be3} = \Delta V_{be6}$ (for example)
where:
$\Delta V_{be4}$=change in base-emitter voltage of transister 118
$\Delta V_{be5}$=change in base-emitter voltage of transister 130
$\Delta V_{be6}$=change in base-emitter voltage of transister 132
and the change in output voltage at the differential outputs 140*a*, 140*b* of the output stage 108, due to changes in positive power supply voltage and base-emitter voltages, will be:

$$\Delta V_{140} = \Delta V_{CCO} - \Delta V_{be4} \Delta V_{be5} - \Delta V_{be6} - \Delta V_{120} = 0$$

Alternately, the foregoing result may be obtained even if the transistors 118*a*, 118*b* of the voltage-follower stage 102 and the transistors of the output stage 108 are not matched to a respective diode-connected transistor 202, 204, 208 of the sensor 104, if the following condition is met:

$$\Delta V_{be1}+\Delta V_{be2}+\Delta V_{be3}=\Delta V_{be4}+\Delta V_{be5}+\Delta V_{be6}$$

As discussed above, preferably the change in current output from each output 128a, 128b of the output signal compensator 106 is twice the change in output current produced by the sensor 104. From the foregoing calculations, it will be apparent that this design choice reduces the power consumption of the voltage sensor 104. Further, this design choice increases the speed of the circuit. However, other current ratios of the output signal compensator 106 may be used, provided a suitable change is made to the ratio of the resistor 120a, 120b to the sum $R_{212}+R_{214}$.

As discussed above, preferably at least the current density of the transistors 118a, 118b of the voltage-follower 102 and the transistors of the first and second differential voltage followers 130, 132 are matched as close as possible to respective diode-connected transistors of the sensor 104. However, it will be appreciated that, in order for the signal compensating system 100 to compensate for output signal variations, the current densities of the transistors 118a, 118b and the transistors of the first and second differential voltage-followers 130, 132 need only be equal to the current density of the respective transistors of the sensor 104. In this latter variation, the signal-level compensating system 100 may not completely cancel variations in output signal voltage at the differential outputs 140 unless, although the uncompensated variation will be negligible. Further, it is believed that the current densities need not be matched to compensate for output signal variations, although the performance of such a system may be inferior to a system employing matched transistors or a system employing transistors of matching current densities.

Figure 2D:
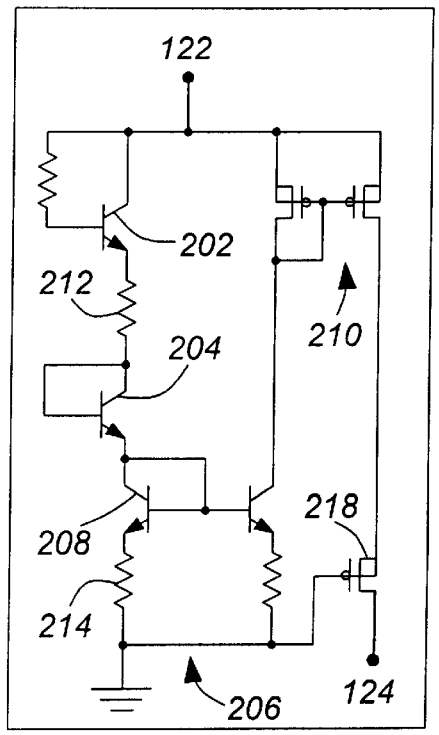
Figure 2E:
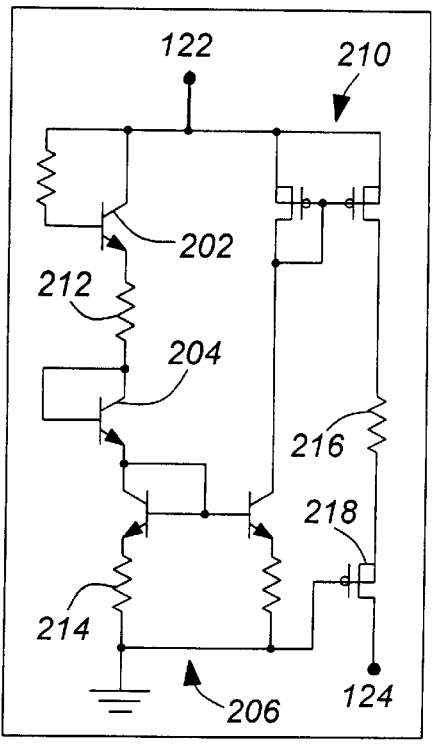

The remaining implementations of the sensor 104 shown in FIGS. 2a to 2j are substantially similar in operation to the sensor 104 shown in FIG. 2c, but with some minor differences. For instance, since the transistor of the output signal compensator 106 connected to control input 126 has its source terminal below substrate voltage (to be discussed below) and the transistors of the second current mirror 210 are referenced to $V_{CCO}$, the sensor 104 shown in FIG. 2c includes a resistor 216 in series with the current output of the second current mirror 210 in order to provide over-voltage protection for the second current mirror 210. Further, the resistor 216 also reduces the possibility of noise from the positive power supply. However, as shown in FIG. 2d, the sensor 104 may include instead a nMOS transistor 218 cascode-connected with the output of the current mirror 210, instead of the resistor 214, or may include both a resistor 216 and a MOS cascode-connected transistor 218, as shown in FIG. 2e.

Figure 2F:
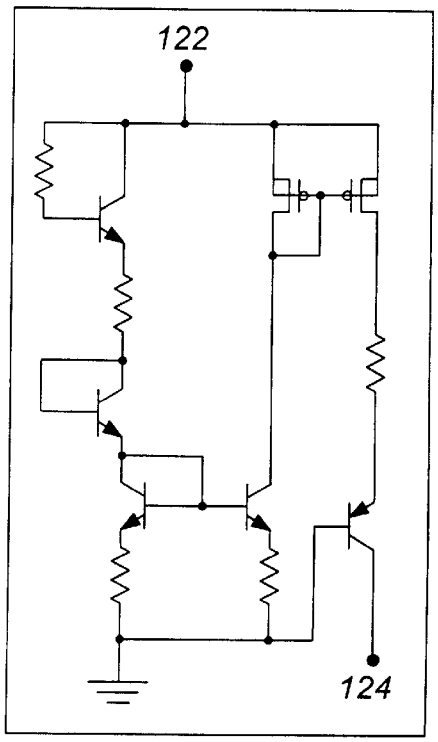
Figure 2G:
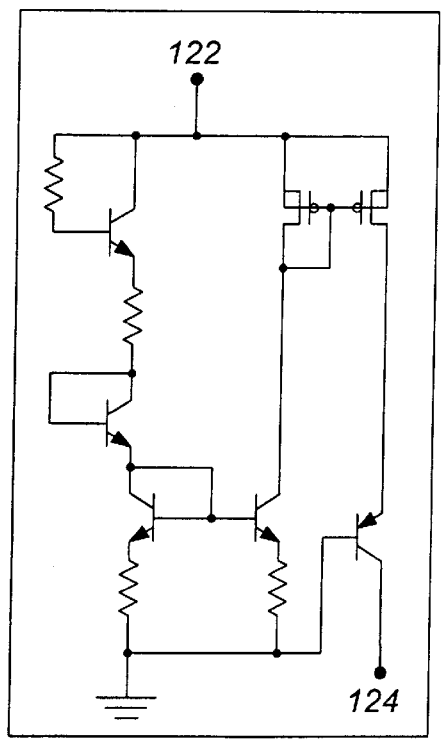
Figure 2H:
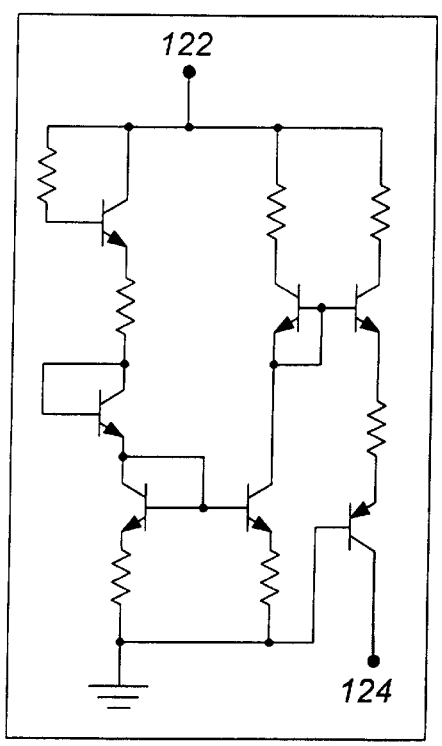

The sensors 104 shown in FIG. 2f and FIG. 2g are substantially identical to the sensors 104 respectively shown in FIG. 2e and FIG. 2d, except that the nMOS cascode-connected transistors 218 are replaced with PNP cascode-connected transistors. Similarly, the second current mirrors 210 of the sensors 104 shown in FIG. 2e and FIG. 2d comprise MOS transistors, whereas the second current mirrors 210 of the sensors 104 shown in FIG. 2h and FIG. 2i comprise PNP transistors. The sensor 104 shown in FIG. 2j will be described below.

The sensor 104 shown in FIG. 2a and FIG. 2b are simpler implementations of the sensor 104. For instance, the sensor 104 shown in FIG. 2a includes two diode-connected NPN transistors and one nMOS transistor all connected in series.

This variation has the advantage of reduced power consumption over the other implementations since only one current is drawn from the positive power supply. However, as this variation assumes that the $V_{gs}$ voltage drop of the nMOS transistor will be approximately equal to one base-emitter voltage drop, there may be slight reduction in performance if $V_{gs}$ does not accurately track a base-emitter voltage drop. The sensor shown in FIG. 2b is similar to the sensor 104 shown in FIG. 2a, except that the variation shown in FIG. 2b uses a PNP transistor in replacement of the nMOS transistor and may, therefore, also suffer from a slight reduction in performance.

FIGS. 3a–3d depict various implementations of the output signal compensator 106. However, it should be understood at the outset that the output signal compensator 106 is not limited to the variations shown in FIG. 3, but includes any output signal compensator capable of cooperating with the voltage-follower stage 102 so as to reduce variations in output signal arising from variations in power supply voltage or transistor characteristics.

Figure 3B:
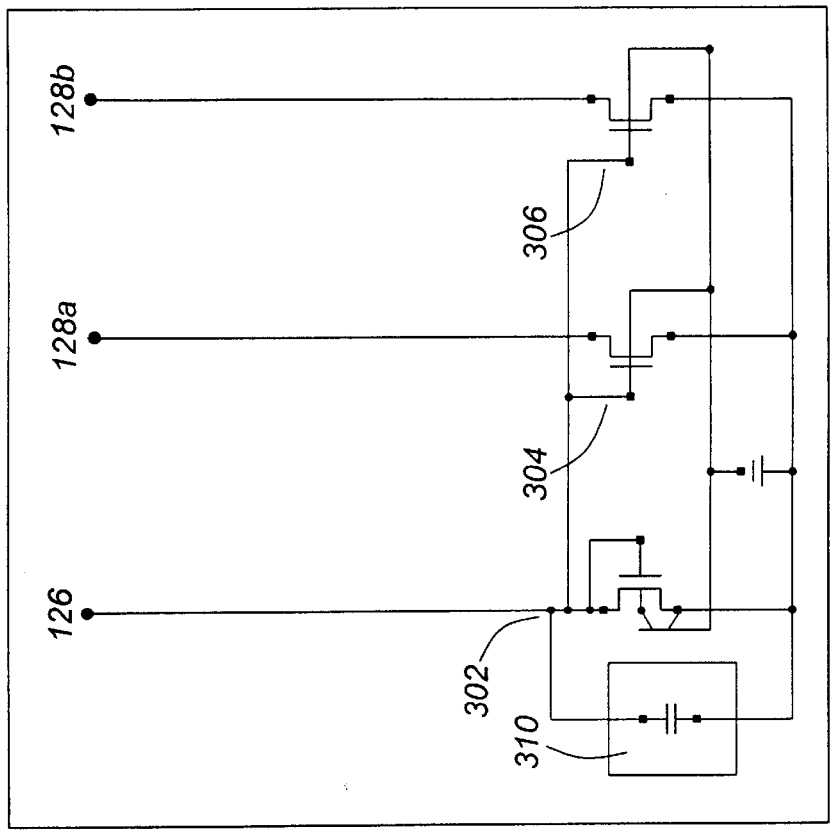
FIGS. 3a–3d are schematic diagrams of various implementations of the output signal compensator shown in FIG. 1.
Figure 3A:
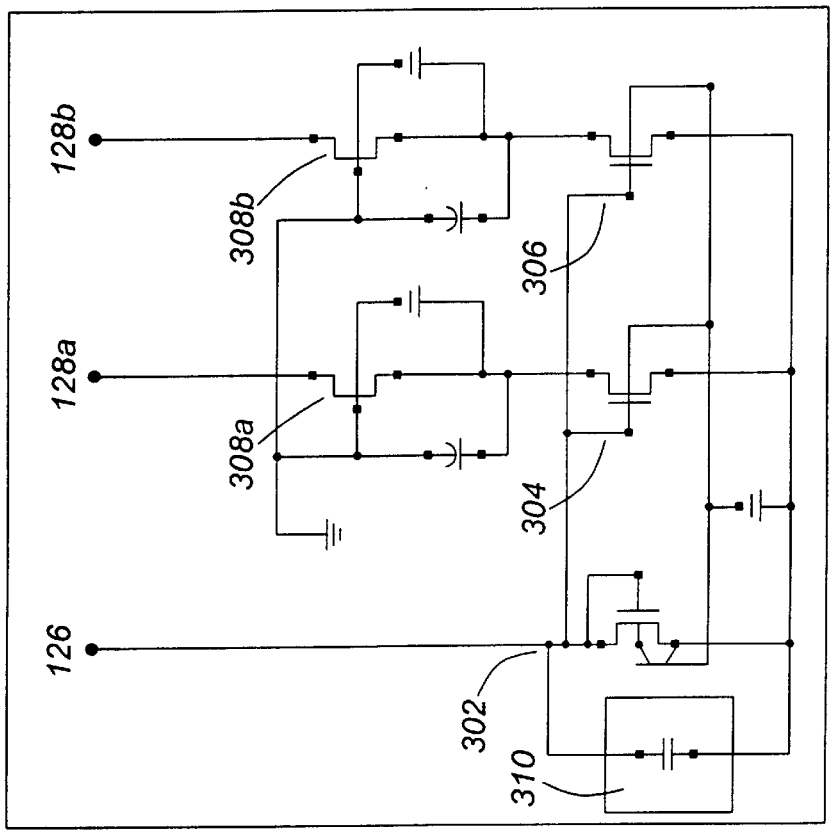

Turning to FIG. 3a, a preferred implementation of the output signal compensator 106 is shown configured as a current mirror, and comprising a diode-connected master transistor 302, a first slave transistor 304, and a second slave transistor 306 coupled to the master transistor 302. Since the output voltage at the signal outputs 112a, 112b of the voltage-follower stage 102 will vary in accordance with the input signals delivered to the signal inputs 110 of the voltage-follower stage 102, the output signal compensator 106 also includes a first cascode-connected transistor 308a connected to the current output of the first slave transistor 304, and a second cascode-connected transistor 308b connected to the current output of the second slave transistor 306 to reduce the impact of the changes in output voltage at the signal outputs 112 on the current magnitude of provided by the first and second slave transistors 304, 306. However, as will be apparent below, the first and second cascode-connected transistors 308a, 308b are not essential, and may be eliminated in applications where the desired output signal specification of the signal-level compensating system 100 is sufficiently forgiving.

The transistors 302, 304, 306, 308 of the current mirror 106 are operated below substrate voltage to Increase the headroom available at the differential signal outputs 112a, 112b of the voltage-follower stage 102 for voltage compensation. As a result, the transistors 302, 304, 306, 308 comprise insulated nMOS transistors, although it is believed that any transistor which can operate with its collector/drain terminal below substrate voltage can also be used.

Figure 4:
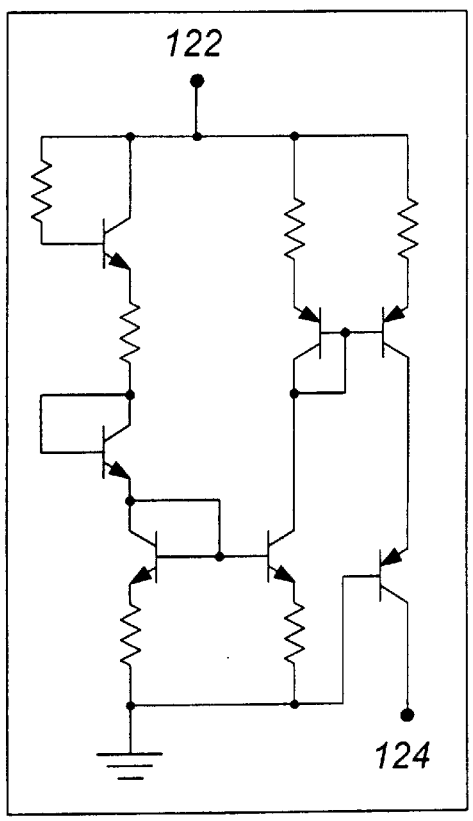
FIG. 4 is a schematic diagram of a preferred implementation of a transient-suppressing capacitor for use with the output signal compensators shown in FIG. 3.
Figure 4:
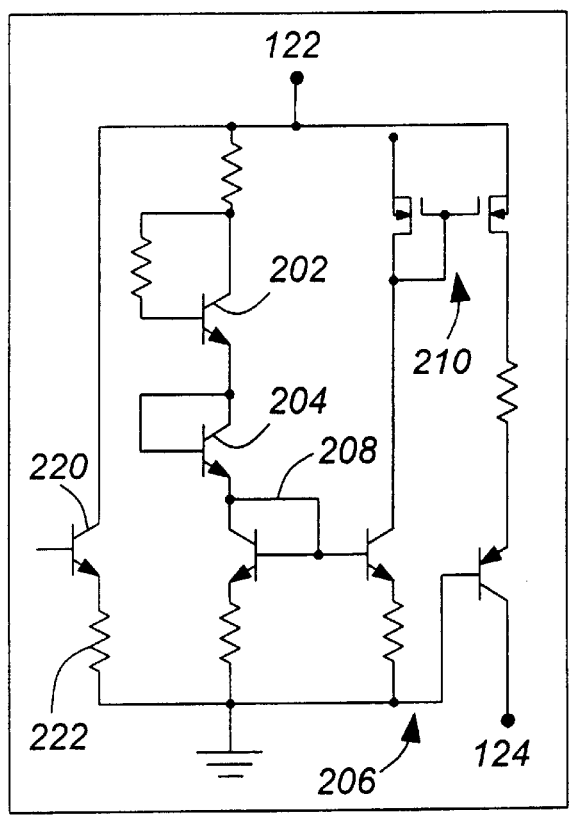
Figure 4:
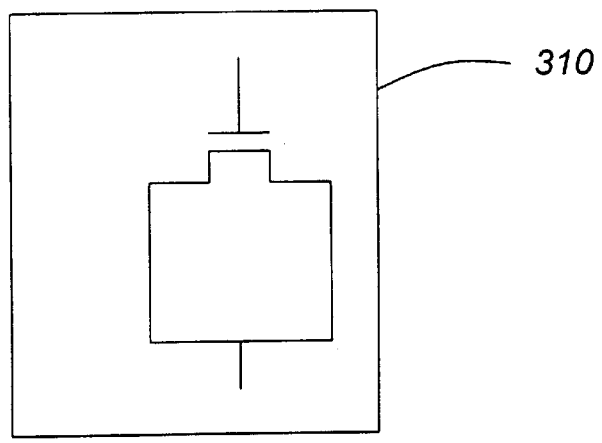

The output signal compensator 106, shown in FIG. 3a, includes a shunt capacitor connected across the gate-source terminals of the cascode-connected transistors 308a, 308b to reduce the Impact on the cascode-connected transistors 308a, 308b of noise from the power supply and transients. The output signal compensator 106, shown in FIG. 3a, also includes a capacitive circuit 310 connected across the master transistor 302 to reduce the impact of power supply noise on the output current characteristics of the output signal compensator 106. As shown in FIG. 4, since the capacitive circuit 310 is required to operate below substrate voltage, preferably the capacitive circuit 310 comprises an insulated nMOS transistor whose gate terminal is connected to the gate and drain terminals of the master transistor 302, and whose drain and source terminals are connected to the source terminals of the transistors 302, 304, 306.

Figure 3D:
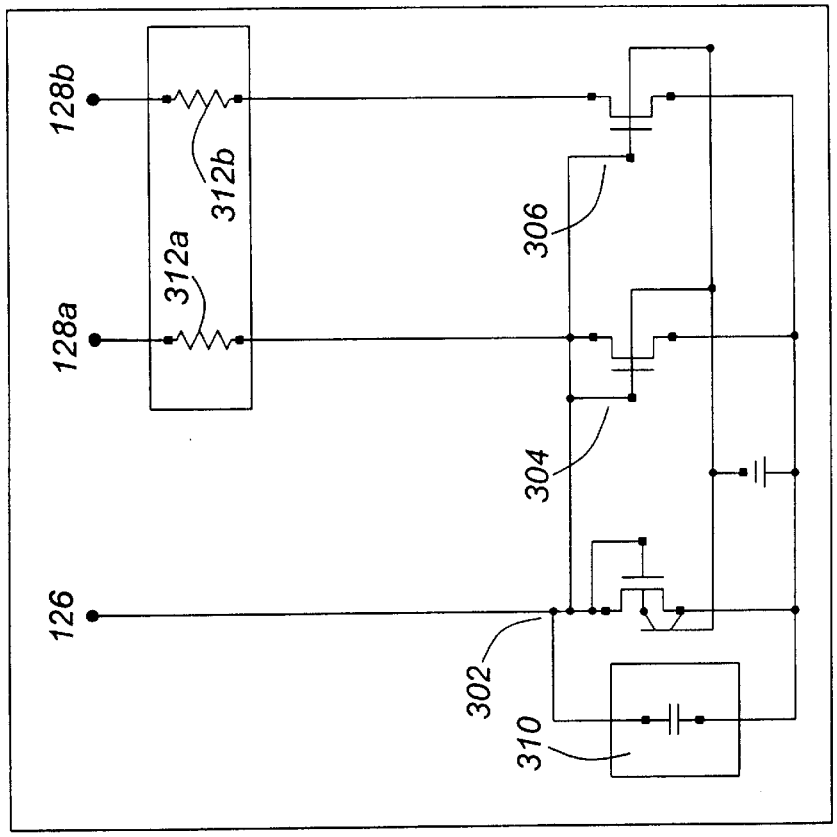
Figure 3C:
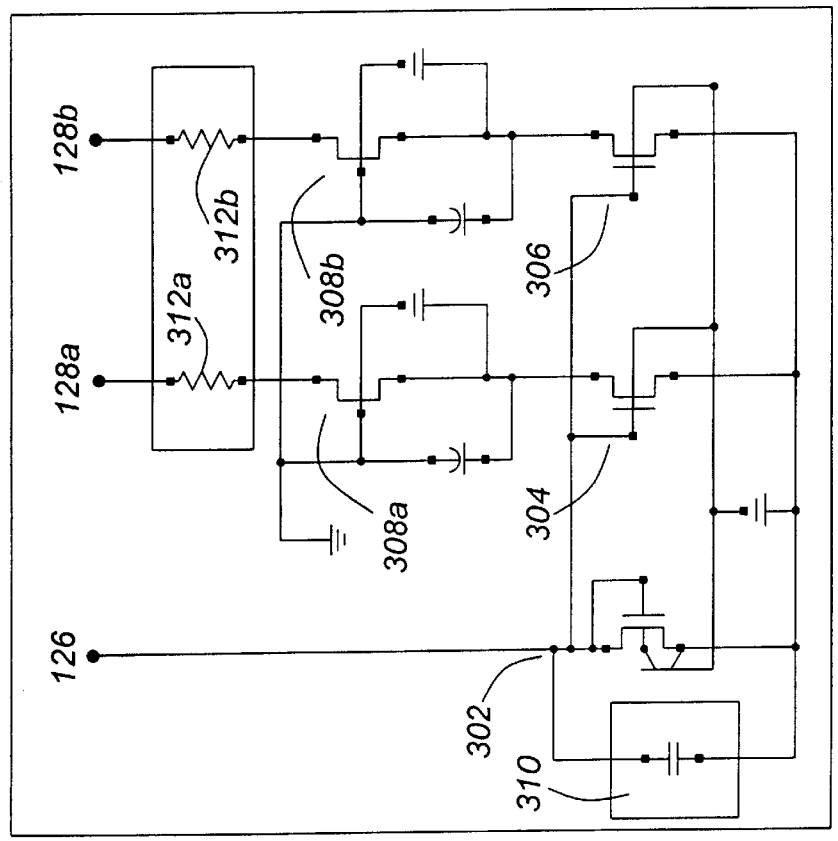

The remaining implementations of the output signal compensator 106 shown in FIGS. 3b to 3d are substantially similar in operation to the output signal compensator 106 shown in FIG. 3a, but with some minor differences. For instance, the output signal compensators 106 shown in FIG. 3b and FIG. 3d lack the cascode-connected transistors 308a, 308b, and the output signal compensators 106 shown in FIG. 3c and FIG. 3d include resistors 312a, 312b each in series with a respective output transistor and a respective signal output 128a, 128b for signal shaping.

Numerous variations upon the signal-level compensating system 100 may be realized. For instance, as discussed above, the signal-level compensating system 100 may be configured to receive a differential or a single-ended communication signal. The value of the resistor 120a, 120b of the voltage-follower stage 102 and the current gain of the current mirror 106 may be adjusted to vary the degree and speed of compensation, and to adjust the power dissipation of the compensating system 100. The number of voltage follower stages of the output stage 108 may be varied in accordance with the degree of level shifting required to meet the output signal specification. Further, although it is believed that having voltage compensation occur before the signal reaches the output stage 108 allows the power dissipation through the resistors 120a, 120b to be reduced, it is also believed that the output of the current minor 106 may be relocated so as to allow voltage compensation to take place at one of the voltage-followers of the output stage 108. Also, it is believed that if the output signal specification is defined by changes in current levels, rather than changes in voltage levels, the resistive-load stage 116 may be eliminated and the voltage-follower stages replaced with current follower stages so as to provide output signals which are substantially free of current variations which might otherwise be caused by variations in positive power supply or base-emitter transistor voltages.

Figure 5:
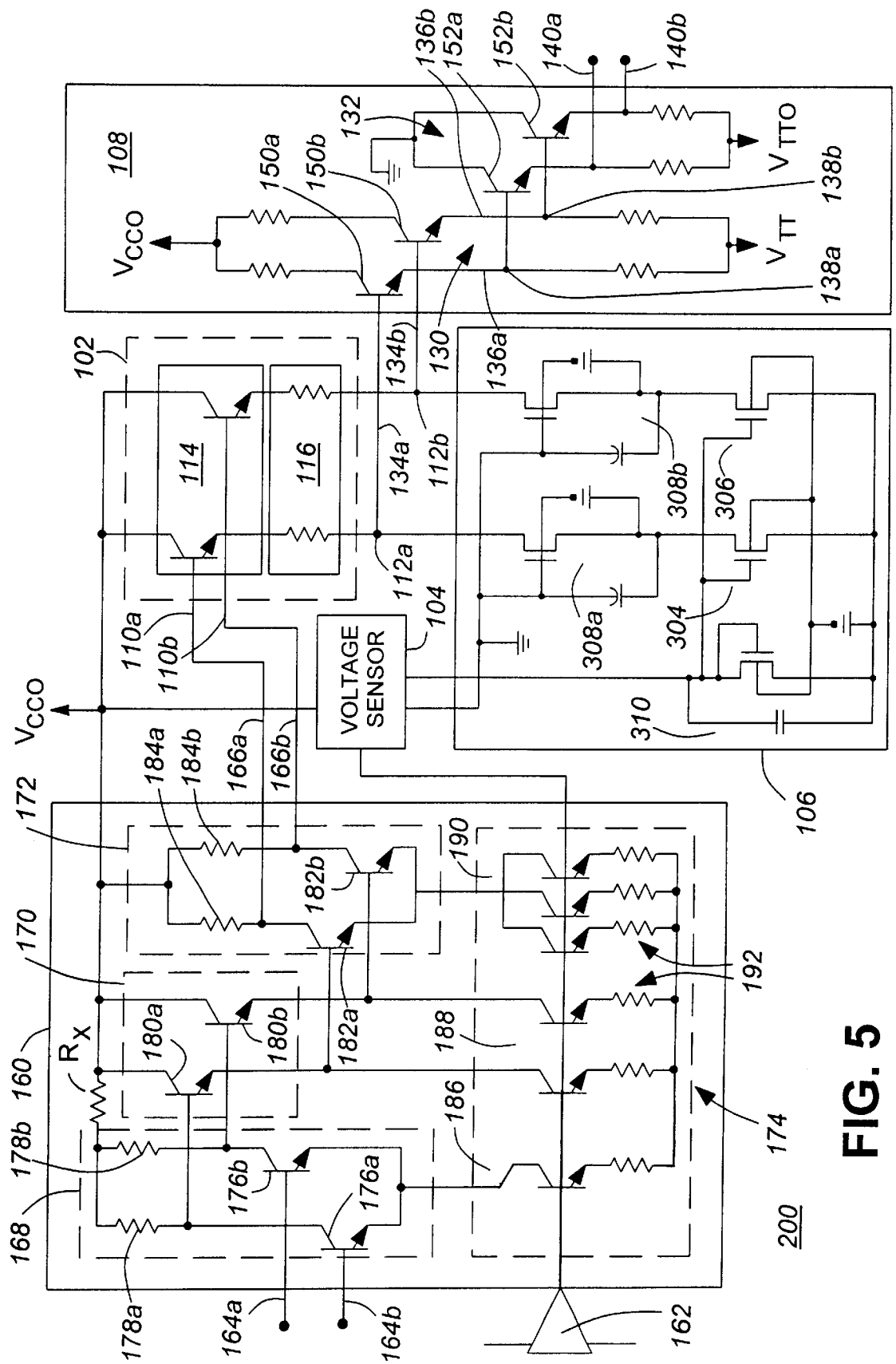
FIG. 5 is a schematic diagram of a variation of the signal-level compensating system shown in FIG. 1, including a signal conditioner input stage for receiving CML differential input signals from an external emitter-follower output, and an output stage for providing ECL differential output signals.

Turning to FIG. 5, a preferred implementation of the signal-level compensating system, denoted generally as 200, is shown comprising the voltage-follower stage 102, the sensor 104, the output signal compensator 106 and the output stage 108 of FIG. 1; and a signal-conditioner input stage 160, and a band-gap voltage reference 162 all fabricated upon a common integrated circuit substrate. The signal-level compensating system 200 is particularly advantageous since it allows the amount of output signal swing of the output stage 108 to be set independently of the amount of compensation. Further, the signal-level compensating system 200 boosts the signal level of the input signals transmitted to the voltage-follower stage 102 so as to allow the circuit 200 to receive input signals whose logic high voltage levels are a base-emitter voltage drop below positive power supply voltage (such as where an external emitter-follower output stage is used) without a reduction in voltage compensation capabilities.

The output stage 108 comprises a first differential voltage-follower 130, and a second differential voltage-follower 132 which together provide differential output signals representative of the differential input signals applied to the voltage-follower stage 102 but shifted to ECL levels. The first differential voltage-follower 130 includes a first pair of identical NPN transistors 150a, 150b configured as emitter-followers, a pair of differential inputs 134a, 134b, and a pair of differential outputs 136a, 136b. Similarly, the second differential voltage-follower 132 includes a second pair of identical NPN transistors 152a, 152b configured as emitter-followers, a pair of differential inputs 138a, 138b, and a pair of differential outputs 140a, 140b. Alternately, the first and second voltage-followers 130, 132 may be implemented as a differential source-followers with MOS transistors, or with any other transistor suitable for the intended application.

As discussed above, the transistors 150a, 150b, 152a, 152b are matched as close as possible to the respective transistors of the sensor 104. The differential inputs 134a, 134b of the first differential voltage-follower 130 are each coupled to a respective differential signal output 112a, 112b, and the differential inputs 138a, 138b of the second differential voltage-follower 132 are each coupled to a respective differential output 136a, 138b of the first differential voltage follower 130. As will be apparent, the first differential voltage-follower 130 reproduces the output signal of the differential signal output 112a, 112b but shifted down in voltage by one base-emitter voltage drop. Similarly, the second differential voltage-follower 132 reproduces the output signal of the first differential voltage-follower 130 but shifted down in voltage by another base-emitter voltage drop.

The signal-conditioner input stage 160 includes differential signal inputs 164a, 164b for receiving CML input signals from an emitter-follower stage (not shown) of a circuit external to the integrated circuit, and differential signal outputs 166a, 166b for providing an output signal responsive to the input signals, and comprises a first differential buffer 168 coupled at its differential inputs to the differential signal inputs 164a, 164b, a differential voltage-follower 170 coupled to the first differential buffer 168, a second differential buffer 172 coupled to the differential voltage-follower 170, and a current sink 174 coupled to the differential buffers 168, 172 and the differential voltage-follower 170.

The first differential buffer 168 comprises a pair of identical NPN transistors 176a, 176b, and a pair of identical resistors 178a, 178b having a common connection point at one end and being connected to a respective collector at the other end. The first differential buffer 185 also includes a resistor Rx connected between the positive power supply and the common connection point of the resistors 178a, 178b to shift the output voltage of the first differential buffer 168 downwards a fixed amount to meet the output signal specification, if necessary.

The differential voltage-follower 170 comprises a pair of identical NPN transistors 180a, 180b, configured as emitter-followers, whose collectors are connected to the positive power supply, and whose bases are each connected to a respective collector of the transistors 176a, 176b of the first differential buffer 168.

The second differential buffer 172 comprises a pair of identical NPN transistors 182a, 182b whose bases are each connected to a respective emitter of the transistors 180a, 180b of the differential voltage-follower 170, and whose collectors are each connected to a respective signal input 110a, 110b of the voltage-follower stage 102. The second differential buffer 172 also includes a pair of identical resistors 184a, 184b each being connected between the positive power supply and a respective collector of the transistors 182a, 182b.

The current sink 174 comprises a first NPN transistor 186 whose collector is connected to the emitters of the transistors 176a, 176b of the first differential buffer 168, a pair of matched NPN transistors 188 (comprising transistors 188a, 188b) whose collectors are each connected to a respective emitter of the transistors 180a, 180b of the differential voltage-follower 170, and a triplet of matched NPN transistors 190 (comprising transistors 190a, 190b, 190c) whose collectors are connected in common to the emitters of the transistors 182a, 182b of the second differential buffer 172. The current sink 174 also includes a plurality of matched resistors 192, with each resistor 192 being connected between a respective emitter of the transistors 186, 188, 190 and ground. As will be appreciated, the first and second differential buffers 168, 172, the differential voltage-follower 170 and the current sink 174 may be implemented using FFT transistors, or any other suitable transistor.

The band-gap voltage reference 162 includes a voltage-follower configured output transistor (not shown) which is matched to the transistors 186, 188, 190, and an emitter resistor (of resistance R) connected between the emitter terminal of the output transistor and ground and matched to the resistors 192 of the current sink 174. The base output of the output transistor is connected to the bases of the transistors 186, 188, 190, and biases the transistors 186, 188, 190 with a voltage of:

$$V_{bias} = V_{be} + V_R$$

where: $V_{bias}$=output voltage of the voltage reference 162

$V_{be}$=base-emitter voltage of voltage-follower transistor of the voltage reference 162

$V_R$=constant voltage drop across the emitter resistor of the voltage reference 162

The resistance of each of the resistors 192 is equal to the resistance R of the emitter resistor. Therefore, the collector current of each of the transistors 186a, 186b, 186c, 188a, 188b, 190a, 190b, 190c of the current sink 174 will remain at:

$$i_c = \frac{V_R}{R}$$

where: $i_c$=collector current of the transistors 186, 188, 190

The voltage drop across the resistor 184a, 184b when the corresponding transistor 182a, 182b of the second differential buffer 172 is in the conducting state will then be:

$$\Delta V_{184} = 3V_R * \frac{R_{184}}{R}$$

where: $\Delta V_{184}$=voltage drop across the resistor 184

$R_{184}$=resistance of the resistor 184

With the ECL signal specification requiring output voltage to be between approximately −0.5 v and −1.0 v for logical high and between approximately −1.6 v and −2.0 v for logical low, it is desirable for the signal-level compensating system 200 to maintain the voltage at the output of the output stage 108 at approximately −0.8 v for logical high at approximately −1.8 v for logical low. Since this design choice requires an output signal swing of approximately 1.0 v, $\Delta V_{184}$ will be approximately 1.0 volts. Therefore, with a positive power supply voltage of 3.0 volts, the output voltage of the differential buffer 172 will be at least 2.0 v, thereby preventing saturation of the transistors 186, 188, 190 of the current sink 174 and providing a sufficiently large $V_{ce}$, voltage drop across the transistors 182a, 182b of the differential buffer 172 to allow high frequency operation of the signal-level compensating system 200.

The discussion of the desired voltage swing $\Delta V_{184}$ assumed that the current drawn by the transistors of the output stage 108 will remain constant, independent of the output voltage of the output stage 108. However, in practice, the current density of the transistors of the output stage 108 will be greater when the output voltage of the output stage 108 is at the upper output voltage, and will be less when the output voltage of the output stage 108 is at the lower output voltage. Thus, if the signal-level compensating system 200 is designed to maintain the voltage at the output of the output stage 108 at approximately −0.8 v for logical high, the voltage at the output of the output stage 108 will be slightly greater (less negative) than the desired −1.8 v for logical low even though $\Delta V_{184}$ is set at 1.0 v. Similarly, if the signal-level compensating system 200 is designed to maintain the voltage at the output of the output stage 108 at approximately −1.8 v for logical low, the voltage at the output of the output stage 108 will be slightly less (more negative) than the desired −0.8 v for logical high. To correct for this variation, the resistance of the resistor $R_{184}$ may be increased slightly to increase the voltage swing $\Delta V_{184}$ to the output stage 108.

Other modifications may be undertaken to adjust the output voltage of the output stage 108 by a set amount. For instance, as shown in FIG. 2j, the output signal compensator 106 may be modified to include a bypass transistor 220 in series with a bypass resistor 222, with the bypass transistor 220 and resistor 222 being in parallel with the diode-connected transistors 202, 204, 208, and the resistor being of the same type as the resistors 120. The bypass transistor 220 is biased from the band-gap voltage reference 162 and, therefore, can be used to trim the compensation current produced by the current mirror 106 so as to shift upwards the output voltage of the voltage-follower stage 102. Alternately, the by-pass transistor 220 and resistor 222 may be connected in parallel with the output of the second current mirror 210. On the other hand, in order to shift downwards the output voltage of the voltage-follower stage 102, the by-pass transistor 220 and resistor 222 may be connected in parallel with the output of the first current mirror 206 so as to increase the compensation current produced by the current mirror 106. Other means for adjusting the output voltage of the output stage 108 will be apparent to those skilled in the art.

As will be appreciated, without the signal-conditioner input stage 160, the input signals received at the differential signal inputs 110 of the voltage-follower stage 102 of the signal-level compensating system 200 would be one base-emitter voltage drop lower, due to the external voltage-follower driving the signal-level compensating system 200, than the input signals received at the differential signal inputs 110 of the voltage-follower stage 102 of the signal-level compensating system 100. Accordingly, the signal-conditioner input stage 160 is desirable, particularly for low voltage applications since, absent the signal-conditioner input stage 160, the transistors 190 may become saturated.

Further, it will also be apparent from the foregoing discussion that the voltage swing at the signal outputs 140a, 140b of the output stage 108 is determined by the ratio of the resistance $R_{184}$ of the resistors 184a, 184b of the second differential buffer 172 to the resistance R of the resistors 192 of the current source 174, whereas the degree of voltage compensation is related to the current gain of the current mirror 106, and the ratio of the resistance $R_{120}$ of the resistors 120a, 120b of the voltage-follower stage 102 to the resistance $R_{212}$, $R_{214}$ of the resistors 212, 214 of the sensor 104. Therefore, it will be appreciated that the signal-level compensating system 200 has the notable advantage of allowing the degree of voltage compensation to be set independently of the desired output voltage swing.

The description of the foregoing embodiments is intended to be illustrative and not exhaustive of the present invention. Those of ordinary skill will realize certain additions, deletions and/or modifications to the embodiments described herein which nevertheless will not depart from the spirit or scope of the present invention, as defined by the claims appended hereto.

We claim:

1. A signal-level compensator for communications circuits comprising:
   a voltage-follower stage including a signal input for receiving an input signal, a signal output, and at least one transistor coupled between the signal input and the signal output for providing an output signal at the signal output responsive to the input signal;
   a sensor for sensing variations in at least one of characteristics of the transistor and voltage of a power supply powering the signal level compensator and providing a control signal indicative of the variations; and
   an output signal compensator coupled to the signal output for providing a compensator signal responsive to the control signal for reducing the impact of the variations on the output signal.

2. The signal level compensator according to claim 1, wherein the at least one transistor is configured as a voltage-follower, the voltage-follower stage includes a resistive-load coupled to an output of the voltage-follower, and the output signal compensator comprises a current output device for producing an output current for varying a voltage drop across the resistive-load in accordance with the control signal.

3. The signal-level compensator according to claim 2, wherein the voltage-follower comprises a differential voltage-follower.

4. The signal-level compensator according to claim 2, wherein the control signal comprises a current control signal, and the current output device comprises a current mirror.

5. The signal-level compensator according to claim 1, wherein the sensor comprises a voltage sensor configured to sense variations in at least one of the power supply voltage and a voltage drop across the transistor.

6. The signal-level compensator according to claim 5, wherein the voltage sensor comprises a voltage sensor transistor having transistor characteristics corresponding to the transistor characteristics of the at least one transistors.

7. The signal-level compensator according to claim 6, wherein the voltage sensor transistor is matched to the at least one transistor.

8. The signal-level compensator according to claim 6, wherein the voltage sensor transistor and the at least one transistors have equal current densities.

9. The signal-level compensator according to claim 1, further including an output stage coupled to the signal output for shifting a signal level of the output signal.

10. The signal-level compensator according to claim 9, wherein the output stage comprises an output stage transistor configured as a voltage-follower, and the voltage sensor comprises a voltage sensor transistor having transistor characteristics corresponding to characteristics of the output stage transistor for sensing variations in Characteristics of the output stage transistor.

11. The signal-level compensator according to claim 10, wherein the voltage sensor transistor is matched to the output stage transistor.

12. The signal-level compensator according to claim 10, wherein the voltage sensor transistor and the output stage transistors have equal current densities.

13. The signal-level compensator according to claim 9, wherein the output stage comprises an output stage transistor configured as a voltage-follower, and the voltage sensor comprises voltage sensor transistors having transistor characteristics corresponding to characteristics of the output stage transistor and the transistor characteristics of the at least one transistors.

14. The signal-level compensator according to claim 10, where in the voltage-follower of the output stage comprises a differential voltage-follower.

15. A signal-level shifter comprising:
   a voltage-follower stage including a voltage-follower input for receiving an input signal, a voltage-follower output, and a voltage-follower stage transistor coupled between the voltage-follower input and the voltage-follower output for providing an output signal at the voltage-follower output responsive to the input signal;
   an output stage coupled to the voltage-follower stage and including an output stage transistor for shifting a signal level of the output signal;
   a sensor for sensing variations in at least one of characteristics of the transistors and a voltage of a power supply powering the signal-level shifter and providing a control signal indicative of the variations
   an output signal compensator coupled to the voltage-follower output for providing a compensator signal responsive to the control signal for reducing the impact of the variations on the output signal.

16. The signal-level shifter according to claim 15, wherein the voltage-follower stage transistor is configured as a voltage-follower, the voltage-follower stage includes a resistive-load coupled to an output of the voltage-follower, and the output signal compensator comprises a current output device for producing an output current for varying a voltage drop across the resistive-load in accordance with the control signal.

17. The signal-level shifter according to claim 16, wherein the voltage-follower comprises a differential voltage-follower.

18. The signal-level shifter according to claim 15, wherein the sensor comprises a voltage sensor configured to sense variations in at least one of the power supply voltage and voltage drops across the transistors.

19. The signal-level compensator according to claim 18, wherein the voltage sensor comprises a voltage sensor transistor having transistor characteristics corresponding to the transistor characteristics of the voltage-follower transistor.

20. The signal-level compensator according to claim 18, wherein the voltage sensor comprises a voltage sensor transistor having transistor characteristics corresponding to characteristics of the output stage transistor.

21. A method of compensating for signal-level variations in communications circuits, comprising the steps of
   providing a voltage-follower including a signal input for receiving an input signal, a signal output, and at least one transistor coupled between the signal input and the signal output for providing an output signal at the signal output responsive to the input signal;
   sensing variations in at least one of characteristics of the transistor and a voltage of a power supply powering the voltage-follower and providing a control signal indicative of the variations; and
   adding a compensating signal to the output signal, the compensating signal being responsive to the control signal and having a phase opposite to the variations.

22. A method of claim 21, further comprising:
   sensing validations in characteristics of an output stage coupled to the voltage-follower,
   wherein the step of providing a control signal provides the control signal indicative of the variations including the variations associated with the output stage.

* * * * *